(12) United States Patent
Johnson

(10) Patent No.: US 6,207,346 B1
(45) Date of Patent: Mar. 27, 2001

(54) WATERBORNE PHOTORESISTS MADE FROM URETHANE ACRYLATES

(75) Inventor: Steven M. Johnson, Rehovot (IL)

(73) Assignee: Advanced Coatings International, Rehovot (IL)

( * ) Notice: Subject to any disclaimer, the term of this patent is extended or adjusted under 35 U.S.C. 154(b) by 0 days.

(21) Appl. No.: 09/056,636

(22) Filed: Apr. 8, 1998

Related U.S. Application Data

(60) Provisional application No. 60/043,752, filed on Apr. 9, 1997.

(51) Int. Cl.$^7$ ................................ G03F 7/027; G03F 7/16
(52) U.S. Cl. ............................ 430/284.1; 430/277.1; 522/84; 522/85
(58) Field of Search .................. 430/284.1, 277.1; 522/84, 85

(56) References Cited

U.S. PATENT DOCUMENTS

| | | | |
|---|---|---|---|
| 4,153,778 | * 5/1979 | Park et al. | 528/76 |
| 4,849,321 | 7/1989 | Hung et al. | 430/284.1 |
| 4,988,605 | 1/1991 | Kubota et al. | 430/284.1 |
| 5,089,376 | 2/1992 | Setthachayanon | 430/284.1 |
| 5,290,663 | 3/1994 | Huynh-Tran | 430/284.1 |
| 5,341,799 | 8/1994 | Fifield et al. | 528/49 |
| 5,536,620 | 7/1996 | Dueber et al. | 430/284.1 |
| 5,538,821 | 7/1996 | Kakinuma et al. | 430/284.1 |
| 5,728,505 | 3/1998 | Dueber et al. | 430/284.1 |
| 5,738,916 | * 4/1998 | Noguchi et al. | 427/511 |

* cited by examiner

Primary Examiner—Cynthia Hamilton
(74) Attorney, Agent, or Firm—Blank Rome Comisky & McCauley LLP

(57) ABSTRACT

A waterborne photoimageable composition or photoresist comprises a latex binder polymer based on a waterborne dispersion of a photopolymerizable urethane acrylate oligomer having sufficient carboxylic acid functionality to render it develop able in alkaline aqueous solution and a photo initiator chemical system and other components to produce an aqueous coatable and alkali develop able photoresist composition.

35 Claims, No Drawings

WATERBORNE PHOTORESISTS MADE FROM URETHANE ACRYLATES

This application claims the benefit of U.S. provisional application Ser. No.60/043,752, filed Apr. 9, 1997. This priority is claimed under 35 U.S.C. 119(e) in applicant's declaration.

The present invention is directed to methods of coating circuit boards including photoresists, such as those used in the manufacture of printed circuit boards and more particularly to waterborne, liquid plating/etching photoresists, soldermasks and waterborne protective coatings.

BACKGROUND OF THE INVENTION

Photoimageable compositions useful as resists for forming printed circuits, printing plates, solder masks or the like have been used for some time now. The earliest photoresists were solvent-borne and solvent developable. The invention of aqueous developable resists represented an advance in reducing solvent emissions in the printed circuit board manufacturing plant and the environment in general. This can be seen from U.S. Pat. Nos. 4,100,047, 4,564,580 and 4,133,909, herein incorporated by reference, which describe aqueous coatings, also from U.S. Pat. Nos. 3,953,309 and 4,361,640, herein incorporated by reference, which teach aqueous developing compositions. The continued emphasis in reducing organic solvents has spurred the search for waterborne photoresists which are formulated and applied as aqueous liquids with out the addition of any organic solvents.

A critical requirement for photoresist, especially liquid photoresist, is the ability to evaporate the solvent carrier during a brief heat cycle to yield a tack-free surface. This permits intimate contact with the artwork used to define the image. Another requirement is the ability of the liquid photoresist to fully wet the surface and form a continuous film as the copper clad laminate used to manufacture printed circuit boards often has a variety of surface irregularities. These requirements have limited the development of successful waterborne products of this type.

U.S. Pat. No. 5,045,435, herein incorporated by reference, describes a waterborne photoresist composition which is developed in alkaline aqueous solution. The composition comprises a multi functional monomer, a photo initiator and a latex of water-insoluble carboxylated acrylic copolymer. To stabilize the composition and adjust the viscosity, this patent teaches neutralizing the latex polymer to at least 25% with a base, such as ammonia, another amine, or sodium hydroxide.

A liquid such as a waterborne photoresist liquid will only wet and spread over a surface if the forces of attraction between the liquid and the substrate are greater than the cohesive forces within the liquid. Accordingly, the surface energy of the liquid must be at or below the surface energy of the substrate. Thus, to coat a copper substrate having a surface energy of 35 dynes/cm, the surface energy of water, which has a surface energy of 72 dynes/cm, must be reduced. U.S. Pat. No. 5,045,435 teaches that this can be accomplished with the aid of a suitable surfactant.

A surfactant is a material with both hydrophillic and hydrophobic properties. Surfactants can be divided into three major chemical classes; hydrocarbons, silicones and fluorochemicals, these designations referring to the hydrophobic portion of the molecule. The hydrophobe is attached to a hydrophilic group, which can be anionic, cationic or non-ionic in nature.

According to U.S. Pat. No. 5,389,495, herein incorporated by reference, neither hydrocarbon surfactants nor silicon surfactants are particularly suitable in waterborne photoimageable compositions. Although all types of surfactants are found to sufficiently lower surface energy, it is found that hydrocarbon and silicone surfactants encounter problems with respect to dewetting of the copper substrate. Dewetting produces voids which results in an unsuitable coating. Furthermore, if the photoimageable composition is intended as a plating resist, silicone from the silicone-based surfactant can leach into the plating solution, creating potential bath failure. Of the major classes of surfactants, hydrocarbon based surfactants are found to be the least effective in reducing the surface tension of the liquid and do not produce defect-free coatings. Furthermore, hydrocarbon based surfactants contribute to the overall volatile organic components (VOCs) in the coating, which is contrary to the purpose of producing waterborne coatings.

U.S. Pat. No. 5,045,435 gives examples wherein fluorocarbon-based surfactants are used in waterborne photoimageable compositions but applicant has found that these compounds do not perform well and produce undesirable side effects. U.S. Pat. No. 5,389,455 gives examples wherein fluoroaliphatic oxyethylene adduct surfactants are used in waterborne photoimageable compositions. Applicant has found that these compounds are difficult to work with in a production environment and results can vary substantially with a change in surfactant concentration as small as 0.1% by weight of the surfactant.

SUMMARY AND OBJECTS OF THE INVENTION

It is a general object of the present invention to wholly eliminate the critical dependence on a separate surfactant to lower the surface tension between a water borne photoimageable composition and a surface by the use of binder polymers which can inherently act as surfactants, wetting the copper surface, to yield a photoimageable composition with acceptable coating quality.

It is an object of this invention to use these photo imageable compositions as a general protective coating, as a photoimagable composition for forming printed circuits, printing plates chemically milled parts and solder masks.

It is also an object of this invention to utilize as a base polymer for the photoimageable composition, a polymer that is UV reactive, soluble in both water and a caustic solution and will yield a tack-free surface after evaporation of the water. This approach is a departure form the standard technique of dispersing a multi-functional monomer and a photoinitiator into a latex of water-insoluble carboxylated acrylic copolymer.

The waterborne coatings provided by this invention completely avoid the use of organic carrier solvents. When photopolymerized these coatings are readily soluble in alkali but are resistant to the etching and plating solutions characteristic of the printed circuit board industry. Further, when they are subjected to an elevated temperature cure following photopolymerization, these coatings can withstand soldering and other rigorous environments.

DESCRIPTION OF THE INVENTION

A waterborne photoimageable composition comprised of (A) between about 30 and about 98 wt % of a binder polymer that is a waterborne dispersion of an aliphatic urethane acrylate oligomer, containing both anionic and non-ionic moieties, having carboxylic acid functionality which provides an acid number of between about 8 and 250; (B) between about 1 and about 25 wt % of a photoinitiator or photoinitiator chemical system which generates free radicals and (C) between about 1 and about 40 wt % of a neutralizing base can be used to coat a surface prior to photo polymerization of the exposed portions of the coated surface.

In a preferred composition for an etch/plating resist, a latex of an aliphatic urethane acrylate oligomer binder polymer, with an acid number of at least 12.5, neutralized with base, in at least 60% water is combined with 1) a water soluble di, tri or tetra functionalized acrylate monomer and/or an acid functionalized di, tri or tetra functionalized methacrylate oligomer neutralized in ammonia 2) a photoinitiator and, 3) optionally, a colorant. This composition provides a tack-free surface, a smooth, void free coating on metals such as copper and after photopolymerization is able to withstand plating and etching solutions. The di, tri, or tetra acrylate or methacrylate monomers or mixtures of these monomers are very useful in increasing the cross-ink density of the coating after irradiation with actinic light.

In a preferred composition for a solder mask, a latex of an aliphatic urethane acrylate oligomer binder polymer, with an acid number of at least 12.5, neutralized with base, in at least 60% by weight of water is combined with 1) a water soluble di, tri or tetra functionalized acrylate monomer and/or an acid functionalized di, tri or tetra functionalized methacrylate oligomer neutralized in ammonia and or mixtures of the respective monomers and oligomers 2) a partially -acrylated Bisphenol A-epoxy 3) a photoinitiator and 5) optionally, a colorant. This coating provides a tack-free coating on a metal, such as copper, is readily develop able in alkali and after an elevated temperature post-cure is resistant to soldering and functions as a dielectric. Surprisingly, in both of these formulations the acid functional methacrylate oligomer and Bisphenol A-epoxy which are not inherently water soluble, can be blended with the water soluble materials to form a homogeneous, stable mixture or a stable latex in water suspension.

Waterborne urethane oligomers dispersions useful in the photoimageable composition of the present invention are typically prepared by condensation polymerization followed by dispersion in water and anionically. stabilized by neutralizing the acid in the backbone of the polymer with an amine or sodium counter ion. The typical synthetic route to producing the urethane oligomer is by reacting an isocyanate with a polyol and a dispersing diol.

Urethanes with their terminal NCO groups are inherently hydrophobic and insoluble in water. It has been known that hydrophilic functionality can be built into the macromolecular polyurethane chain by replacing a small portion of the aforementioned polyols, or isocyanates with special anionic, cationic, or non-ionic groups rendering the isocyanate prepolymer readily dispersible in water. The low molecular weight pre-polymer is then combined under shear with an inert anionic neutralizing compound, water and diamines to extend the chain, the hydroxy ester of an acrylic or methacrylic acid is then used to end cap the isocyanate groups of the urethane polymer as is shown in Formula 1.

OCN—R—NH—C(O)—O—R$^1$—O—C(O)—NH—R—NH—C(O)—O—CH$_2$—C(CH$_3$)(CO$_2$H)—CH$_2$—O—C(O)—NH—R—NH—C(O)—O—R$^1$—O—C(O)—
<u>NH</u>—R—NCO+NH$_2$—R$^2$—NH$_2$, H$_2$O, R$^3{}_3$N⇒

OCN—R—NH—C(O)—O—R$^1$—O—C(O)—NH—R—NH—C(O)—O—CH$_2$—C(CH$_3$)(CO$_2$H)—CH$_2$—O—

C(O)—NH—R—NH—C(O)—O—R$^1$—O—C(O)—NH—R—

NH—C(O)—NH—R$^2$—NH—C(O)—NH—R—NH—

C(O)—O—R$^1$—O—C(O)—NH—R—NH—C(O)—O—CH$_2$—C(CH$_3$)(CO$_2$H)—CH$_2$—O—C(O)—NH—R—NH—

C(O)—O—R$^1$—O—C(O)—NH—R—NCO,
R$^3{}_3$NH$^+$+CH$_2$=C(R$^4$)—C(O)—O—A—OH⇒

CH$_2$=C(R$^4$)—C(O)—O—A—O—C(O)—NH—R—NH—C(O)—O—R$^1$—O—C(O)—NH—R—NH—C(O)—O—

CH$_2$—C(CH$_3$)(CO$_2$H)—CH$_2$—O—C(O)—NH—R—NH—C(O)—O—R$^1$—O—C(O)—NH—R—NH—C(O)—

NH—R$^2$—NH—C(O)—NH—R—NH—C(O)—O—R$^1$—O—C(O)—NH—R—NH—C(O)—O—CH$_2$—

C(CH$_3$)(CO$_2$H)—CH$_2$—O—C(O)—NH—R—NH—C(O)—O—R$^1$—

O—C(O)—NH—R—NH—C(O)—O—A—O—C(O)—C(R$^4$)=CH$_2$, R$^3{}_3$NH$^+$ wherein R$^4$ is H or CH$_3$; A is —CH$_2$—, —CH$_2$CH$_2$—, —CH$_2$(CH$_2$)$_n$CH$_2$, or phenyl; R is —CH$_2$—, —CH$_2$—CH$_2$—, —CH$_2$—(CH$_2$)—CH$_2$—, phenyl, isophorone, tetramethyl xylene or dicyclohexyl methane; R$^1$ is —(CH$_2$CH$_2$OCH$_2$CH$_2$)$_m$—; R$^2$ is —CH$_2$—(CH$_2$)$_n$—CH$_2$—; R$^3$ is H, methyl, ethyl, n-propyl or n-butyl ; n is 1 to 10 and m is 1 to 10.

Although aliphatic and aromatic urethanes may be employed in the present invention, aliphatic urethanes are preferred due to their inherent UV stability and overall flexibility. A variety of isocyanates are available, these include; isophorone diisocyanate (IPDI), tetramethylxylene diisocyanate (TMXDI), dicyclohexy/methane diisocyanate (sold as Desmodur W) and hexamethylene diisocyanate (HDI) as well as Poly(propylene oxide) diols and triols, copoly (ethylene oxide-propylene oxide) diols, poly (tetramethylene) oxide diols as well as other polyester diols and triols have been used.

In the present invention anionic internal emulsifiers are used, in particular those with COOH acid functionality as shown in Formula 1. These may include but are not limited to compounds shown in Formula 2.

HO—CH$_2$—C(CH$_3$)(CO$_2$H)—CH$_2$—OH

H$_2$N—(—CH$_2$—)$_4$—CH(CO$_2$H)—NH$_2$

H$_2$N—CH$_2$CH$_2$—NH—CH$_2$—CH$_2$—CO$_2$Na

Formula 2

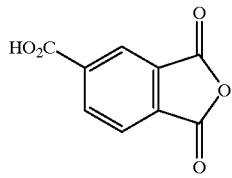

In order to render the internally emulsified polyurethane radiation cureable, acrylic unsaturations are introduced onto the ends of the polymer chains. The term acrylic unsaturations is meant to include not only acrylic by also methacrylic acid moieties. Reactive species may include but are not limited to 2-hydroxyethylacrylate, 2-hydroxyethyl methacrylate and 2-hydroxypropyl acrylate. 2-Hydroxyethyl acrylate is preferred because of the high reactivity of the hydroxyl group with isocyanate in the oligomer synthesis and the high reactivity of the double bond during radiation curing.

The morphology of polyurethane dispersions produced in the foregoing manner, promotes excellent film formation without added co-solvents or wetting agents for 3 distinct reasons:

1) Urethane dispersions are produced at relatively small particle size compared to acrylic latexes such as employed in U.S. Pat. No. 5,389,495. Urethane dispersions have a range of 5–50 nanometers and acrylics 20–140 nanometers. Upon drying, the surface area of the urethane dispersion generates hydrostatic forces that tend to drive the particles together. Further, morphological studies indicate a "swollen" structure with water rich areas on the inside of the macromolecule and a high concentration of carboxyl groups on the surface. The presence of water softens the inside of the polymer, allowing easier deformation and film formation. In the case of acrylic latexes as employed in U.S. Pat. No. 5,389,495 the particles are tougher and more dense requiring co-solvents to soften them enough to form a film.

2) In preparing conventional acrylic dispersions there is a well recognized relationship between the glass transition temperature (Tg) and film hardness. In order to make the photoimageable composition tack-free and hence, contact imageable, the Tg of the acrylic binder polymer preferably must be about 60° C. or higher. Acrylic binder polymers in this range typically require co-solvents to soften and solvate the polymer sufficiently to promote film formation. Aqueous polyurethane dispersions employed in this invention have the important characteristic of being able to provide high film hardness at a lower Tg due to the morphology of the polymer. This remarkable effect enables elimination of volatile organic (VOC) co-solvents and provides exceptional film forming characteristics.

3) Hydrogen bonding from the surface rich carboxyl groups generates sufficient cohesive energy that relatively low molecular weight (as compared to acrylics) polymer appears tack-free and allows contact imaging. In addition, the inherent film forming qualities of these aliphatic urethane dispersions provide exceptional surface coverage, an important consideration in the coating and encapsulation of printed circuit boards. Pinholes and dewets in the coating can lead to extraneous plating and etching. In the case of soldermasks pinholes and dewets lead to extraneous soldering, electrical shorts and other anomalies in the finished product.

In order to stabilize the dispersion and to maintain a constant viscosity for a minimum of 6 months, the carboxylic acid groups must be neutralized by adding base. Suitable bases useful for neutralization can be organic, including, but not limited to, 4-methylmorpholine, 2-amino-2-methyl-1-propanol, 2-dimethylamino-2-methyl-1 propanol, monoethanolamine, N,N-dimethylethanolamine, methyldiethanolamine and morpholine. It is also possible to use inorganic bases, thus eliminating all volatile hydrocarbons. These include but are not limited to ammonia, potassium hydroxide and sodium hydroxide.

The degree of neutralization should be in the range of 2% to 40% and can be adjusted for the specific application method for example screen printing, curtain coating and spraying. The pH must be maintained between 7 and 9 in order to maintain these dispersions which are storage stable for at least 6 months. These anionically modified urethane dispersions do not require stabilization by additional additives such as polyether polyurethane thickeners as taught in above referenced U.S. Pat. No. 5,045,435, and further discussed in U.S. Pat. No. 5,389,495.

Suitable anionically modified polyurethane dispersions can be produced or are available commercially. An example obtained commercially is Neo Rad NR-440 available from Zeneca Resins. It is an aliphatic urethane with a polyester-polyol in the backbone and 2 hydroxyethyl acrylate on the terminal ends. This dispersion is supplied at 40% solids, a pH of 8.0 stabilized with triethanolamine. The particle size is 47 nm. Neo Rad NR-440 has no organic co-solvents and readily forms a contact imageable tack-free film after evaporation of the water.

In addition to the polyurethane binder polymer a photoinitiator or photoinitiator system to generate free radicals must be included at between 1 and 25 wt %. Suitable photoinitiators include but are not limited to Quantacure BMS from Biddle Sawyer, which is [4-(4-methylphenylthio) phenyl] phenylmethanone, Benzophenone, 2 methyl-1 [4-(methylthio)phenyl]-2 morpholino propanone-1 sold by Ciba-Geigy as Irgacure 907.

A suitable photoinitiator system is Irgacure 907 and a mixture of isopropyl thio xanthone (mixture of 2 and 4 isomers) available as Quanticure ITX from Biddle and Sawyer Company. A preferred photoinitiator is a 25:75 blend of bis (2,6 -dimethoxybenzoyl)-2,4, 4-trimethylpentyl phosphine oxide (DMBAPO) and 2-hydroxy-2-methyl-1-phenylpropan-1-one. (HMPP) sold as CGI 1700 by Ciba Geigy.

Though inherently insoluble in water, these photoinitiators can easily be added to the urethane dispersion under high shear mixing and will not de-stabilize the dispersion or settle out.

Surprisingly, an anionically modified waterborne-polyurethane dispersion with only a photoinitiator can act as an etching and plating resist or a soldermask. When 2.5 wt % CGI 1700 was mixed with NeoRad NR-440, it formed a clear, stable single-phase mixture. It readily formed a tack-free film after evaporation of water and yielded a smooth void free surface. When coated on copper foil substrate and processed in the standard process, it was able to function as a plating resists forming 5 mil lines and spaces with copper sulfate electroplating and tin-lead fluoborate electroplating. 5 mil lines could also be formed by using the coating as an etch resist with cupric chloride etchant. Also surprising is the fact that the same combination, when processed in the standard manner and subjected to an elevated temperature post-cure, can function as a soldermask, ie. withstand several cycles of hot air solder leveling, provide exceptional adhesion and provide 3000 volts/mil of dielectric strength.

In addition to components A–C described above, other components may be added to enhance or adjust the properties of the binder polymer. To increase solubility of the photoresist to the caustic developer solution, as well as the hardness of the dried coating, acid functionalized and water soluble acrylic and methacrylic copolymers may be added. These are typically prepared by emulsion polymerization of alpha, beta-unsaturated monomers, such as vinyl, acrylate or styrene monomers. Sufficient acid functionalized monomers are used to provide an acid number between about 50 and about 250, preferably about 100. A typical emulsion polymerization procedure and some examples of suitable emulsion are found in U.S. Pat. No. 3,929,743 which is herein incorporated by reference. An example is NeoCryl BT-175, available from Zeneca Resins. It has an acid number of 100 and is supplied as a 40% solution with a pH of 3.0. Another example is Joncryl 50, available from SC Johnson Polymer. It has an acid number of 238 and is supplied as a 50% solution with a pH of 8.4. These resins readily mix with the waterborne urethane dispersions to form single phase systems. Further, they are solutions of solid polymer so provide a tack free surface after evaporation of water.

Also useful to modify the photoresist properties are styrene/maleic anhydride copolymers. These polymers have both acid and anhydride functional groups available for further reaction, for example, with epoxy groups that may be incorporated in solder mask formulations. An example is Scripset 550 available from Monsanto, synthesized from a 1:1 ratio of styrene and maleic anhydride monomer and molecular weight of approximately 105,000, is supplied as a solid resin and can be easily dispersed in water.

Also useful to modify the processing and functional properties of the polymerized photoresist are mono, di, and tri-functional acrylate and methacrylate monomers and oligomers. These compounds improve the solubility of the non-polymerized portion of the photoresist and improve the toughness and cross link density of the photo polymerized portion of the photoresist. Water soluble monomers and, surprisingly, even water insoluble monomers can be added to improve photoresist exposure time and to increase the cross-link density. An example of a water insoluble acrylate monomers is 2-methoxyethyl acrylate, available as Sr 244 from Sartomer Company. An example of a water insoluble tri-functional acrylate monomer is pentaenithritol tetraacrylate available as Sr 295 from Sartomer Company. This monomer is a slightly gelled liquid at room temperature. The wide latitude of the latex binder polymer is shown as this monomer can be incorporated into the latex with high speed, high shear mixing at levels up to 7% by weight. In addition aliphatic urethane acrylates and aromatic urethane acrylates can also be used.

Examples of water soluble monomers are polyethylene glycol diacrylate available as SR 344 from Sartomer Company and highly alkoxylated triacrylate, available as Sr 9035 from Sartomer Company. These monomers can be tolerated at relatively high levels.

To increase solubility of the photoresist to the caustic developer and promote adhesion to metallic substrates without sacrificing exposure response, acid functional acrylate oligomers may be added. An example is Sarbox 500K60, an aromatic acid methacrylate half ester oligomer blended in polyethylene glycol diacrylate, with acid number of 160. The polyethylene glycol diacrylate renders the oligomer soluble in water. Other oligomers include SB-500E50 a highly functionalized, carboxcylic acid containing methacrylate oligomers blended with ethoxylated trimethylolpropane triacrylate, SB-500K60 and SB-600 a highly functionalized carboxylic acid containing methacrylic acid oligomer blended in a trifinctional methacrylate monomer (all of these compounds are available from Sartomer).

In order to improve final functional properties, especially in the formulation of soldermask, epoxy functional resins may be added. When the developed photoresist is subjected to a high temperature post cure the epoxy groups can be cross linked by the residual carboxylic acid groups or anhydride groups. Though inherently insoluble in water, a wide variety of epoxy resins are available pre-dispensed in water. An example is Epi-Rez 3510-W-60, a 40% solids non-ionic dispersion of bisphenol-A epoxy. No organic solvents are present and it is completely water reducible. To incorporate epoxy functionality without sacrificing exposure response, specialty epoxy resins may be added such as epoxy acrylates including epoxidized soy bean oil acrylate, epoxy novolak acrylate and polybutadiene acrylate. An example is Ebecryl 3605, a 50% acrylated bisphenol-A epoxy resin. Though inherently insoluble in water, this polymer can be added to the binder polymer latex with high shear mixing at levels up to 10% by weight. Other useful bisphenol-A epoxies include brominated bisphenol A epoxies and bisphenol-A epichlorohydrin copolymers as well as aromatic amine based epoxies, epoxidized polybutadienes, and polyglycidyl ethers of tetraphenylene ethane. With all of the above modifying monomers, oligomers and polymers, there is a maximum amount that can be tolerated so as to maintain the tack free surface of the photoresist. This will depend on the molecular weight, viscosity, and molecular identity of the particular modifying compound.

In addition to the foregoing components, minor amounts, typically less than 10% by weight of the latex? of standard modifying agents may be added. These may include dyes and colorants, slip aids and antifoaming additives, antioxidants, fillers and other viscosity modifiers. Many of these additives are insoluble in water but can be easily dispersed in the latex at low levels with high shear mixing.

The preferred method for preparing photoimageable compositions of the present invention is to add the components such as monomers, photoinitiators, defoamers, wetting agents, colorants and viscosity modifiers directly to the stabilized polyurethane binder polymer dispersion under high shear mixing. The pH of water soluble materials and dispersions may need to be adjusted prior to adding to the binder polymer latex so as not to de-stabilize it. High molecular weight and solid additives may need to be melted prior to incorporation at high shear in order to combine these additives to the latex.

The final composition which will generally be between 30 and 60% solids may be coated directly to metal clad laminate or laminate surfaces, using any of the coating systems known in the art for coating solvent-borne liquid photoimageable composition such as, but not limited to, roller coating, dip coating, spray coating, curtain coating and screenprinting. These compositions form continuous smooth coatings that conform to the surface topography. The composition is dried to remove the water and any volatiles, such as ammonia, amines, etc. Drying is carried out generally between 60–80 C. After drying, a continuous film is formed with sufficient adhesion to the surface so as to facilitate any necessary handling.

In another application method the waterborne composition is used to form a dry film. In this method it is applied to a flexible support sheet such as polyethylene terephthalate and dried to remove water and other volatiles. A protective sheet, generally of polyethylene is then applied to the exposed composition to form an easily handleable film. In some cases, it may be advantages, to partially-dry the composition so as to leave residual water content in order to allow the film to conform to surface defects of the substrate such as the copper foil or etched circuits. The film is accumulated in rolls and later laminated to the printed circuit board substrate.

These photoimageable compositions once applied can be processed in the conventional manner. First, using film artwork the composition is selectively exposed to actinic UV radiation. This polymerizes the acrylate functionality in the urethane acrylate binder polymer and any additional monomer or oligomer present. These exposed areas become resistant to developer solution. Subsequently, the unexposed composition is developed away in a dilute alkaline aqueous solution such as 1% potassium or sodium carbonate. Subsequently, etchants known to the art, may be used to remove copper from the areas where resist was removed forming a printed circuit. Alternately, the composition can act as a plating resist whereby tin/lead alloy or other metals are plated in the areas where the resist was removed. After these processes the remaining resist may be removed by using a concentrated alkaline stripper such as 10% sodium hydroxide.

A remarkable feature of this invention is that solder mask compositions can be made using the same urethane acrylate binder polymer. A soldermask is a permanent resist layer applied in the preceding manner but not removed. These coatings serve to protect conductor areas during component soldering and also provide to the circuitry a protective barrier to electrical, chemical and physical damage. Commercial soldermasks must meet minimum requirements as defined in the industry standard, IPC (Institute for Interconnection and Packaging Electronic Circuits) specification; IPC-SM-840 in the Table Criteria for Qualifications/Conformance herein incorporated by reference.

Remarkably, the acrylate urethane binder polymer alone, after photopolymerization and an elevated temperature post cure will withstand soldering and hot-air-solder-leveling. The post cure heating will normally be between 100 and 150 C, preferably between 120 and 140 C. In a preferable composition epoxy resins may be added and cross-inked with the residual —COOH and —OH groups in the urethane acrylate binder polymer. In addition the di, tri and tetra substituted acrylates and methacrylates can be added to modify the composition.

To coat and protect a circuit board the photopolymerizable compositions previously described can be readily coated onto a circuit board, exposed to actinic light to cross link the acrylate groups and optionally heated to between 90 and 150 C, preferrably between 100 and 140 C to stabilize and toughen the coating.

The photopolymerizable coating previously described can also be used in a chemical milling process where a substrate is coated with the photopolymerizable coating to form a film, a mask is placed film and the coating is exposed to actinic radiation. The unexposed portions of the film are washed away from the substrate and the substrate is then etched or chemically milled as is well known in the art.

Printing plates can also be formed from the photoimagable compositions previously describe by the process of coating a suitable plate with a photoimageable compositions to form a film, drying the film, placing a mask over the dried film, exposing the dried film to light, washing out the unexposed portions of the film and heating the plate to between 100 and 150 C, preferably to between 120 and 140 C to toughen the film.

The invention having been generally described, the following examples are given as particular embodiments of the invention to demonstrate the practice and advantages thereof. It is understood that the examples are given by way of illustration and are not intended to limit in any manner the specification or the claims which follow.

EXAMPLE 1

Base Polymer Dispersion

The following parts by weight of ingredients were added with high shear. Ingredients were added to the urethane acrylate dispersion in the following order.

| Name | Type | Parts by Weight |
| --- | --- | --- |
| NeoRad NR-440 (40% Solids) Zeneca | Polymer | 60.0 grams |
| CGI 1700 (Ciba) | Photoinitiator | 1.5 grams |
| Efka 34 (Efka) | Flow Additive | 0.14 grams |
| CW 5 228 (Daniels) | Colorant | 1.12 grams |

The composition ingredients mixed easily to form 2000 centipoise viscosity. Continuous void free films could be formed on both copper foil and the 3-dimensional IPC-B-25 circuit pattern with a pull-down bar or by spraying. After drying, a tack free surface was obtained. The coating was exposed to UV actinic radiation and the unexposed areas were fully developed away in 1% potassium carbonate at 35 C for 90 seconds. On the copper foil panels development resulted in 5 mil. lines and spaces with excellent adhesion to copper. The formulation was able to withstand cupric chloride etching as well as copper and tin-lead electroplating with minimal surface defects. Subsequently, the photoresist fully washed away in a 10% sodium hydroxide solution. To test the composition as a soldermask, after exposure and development, the IPC-B-25 coated boards were subsequently baked at 135 C for 1 hour. The composition was then fully solvent resistant and rated a 100% when tested with the IPC-SM-840 cross-hatch adhesion test. The soldermask withstood 3 cycles of solder leveling with no attack, delamination or solderballing. Further, the samples passed the IPC solderability test and dielectric strength measured 3000 volts/mil. The formulation functioned as above with exposure time down to 350 mjoules.

EXAMPLE 2

A photo polymerizable coating suitable for dip-coating, spraying, curtain coating and roller coating can be prepared as follows.

In order to increase the solubility of the composition and thus, upon development, achieve finer lines/spaces, acid functional monomer/polymers may be added. For example:

| Name | Type | Parts by Weight |
| --- | --- | --- |
| Part A | | |
| Neo Rad NR-440 | Polymer | 60.0 grams |
| CGI 1700 | Photoinitiator | 1.5 grams |
| Efka 34 | Flow Agent | 0.13 grams |
| CW 5228 | Colorant | 1.12 grams |
| Part B | | |
| Neo Cryl BT 175 (Zeneca) 40% solids acrylic copolymer (pH 2) | Polymer | 6.0 grams |
| Ammonia | pH stabilization | 1.80 grams |

In order to add Neo Cryl BT 175 to Part A, the pH had to be adjusted with ammonia to bring the pH from 2 to 8 so as not to cause the NR-440 to de-flocculate. Results were similar to Example 1 but had improved image resolution and developing properties.

EXAMPLE 3

A photo polymerizable coating suitable for dip-coating, spraying, curtain coating and roller coating can be prepared as follows. This composition has improved solubility as well as exposure speed and can be prepared as follows:

| Name | Type | Parts by Weight |
| --- | --- | --- |
| Part A | | |
| NeoRad 440 | Polymer | 60.0 grams |
| CGI 1700 | Photoinitiator | 1.50 grams |
| Efka 34 | Flow Agent | 0.13 grams |
| CW 5228 | Colorant | 1.12 grams |

-continued

| Name | Type | Parts by Weight |
|---|---|---|
| Part B | | |
| SR500K60 (Sartomer) Acid functional methacrylate oligomer (pH 2) | Oligomer | 2.60 grams |
| SR 344 (Sartomer) Polyethylene glycol diacrylate | Monomer | 0.34 grams |
| Ammonia | | 3.78 grams |

In order to add SR500K60 to the Part A, the pH had to be adjusted by addition of ammonia. Results were similar to example 2 but achieved reduced exposure times down to 150 millijoules/cm$^2$.

EXAMPLE 4

A photopolymerizable composition suitable for screen-printing can be prepared as follows:

| Name | Type | Parts by Weight |
|---|---|---|
| Part A | | |
| NeoRad 440 | Polymer | 60.0 grams |
| CGI 1700 | Photoinitiator | 1.50 grams |
| Efka 34 | Flow Agent | 0.13 grams |
| CW 5228 | Colorant | 1.12 grams |
| Part B | | |
| SR 500K60 | Oligomer | 2.60 grams |
| SR 344 | Monomer | 0.34 grams |
| DSX 1550 (Henkel) | Associative Thickener | 0.66 grams |
| Ammonia | | 3.78 grams |

Results were similar to Example 3. A viscosity of 20,000 centipoise was obtained and the photoresist/soldermask could be screenprinted easily.

EXAMPLE 5

A superior soldermask formulation which is suitable for dip-coating, spraying, curtain-coating and roller coating. To improve functional properties for a soldermask an epoxy-functional resin can be added to the formulation.

| Name | Type | Parts by Weight |
|---|---|---|
| Part A | | |
| NeoRad NR440 | | 60.0 grams |
| Ebecryl 3605 (Radcure) Partially acrylated Bisphenol A Epoxy | | 2.40 grams |
| CGI 1700 | | 1.50 grams |
| Efka 34 | | 0.13 grams |
| CW 5228 | | 1.12 grams |
| Part B | | |
| SR 500K60 | | 2.60 grams |
| SR 344 | | 0.34 grams |
| Ammonia | | 3.78 grams |

Results were similar to Example 3 but achieved superior soldermask functional properties. The properties obtained are as follows:

| | |
|---|---|
| Dielectric Strength | 3600 Volts/mil |
| IPC Hydrolytic Stability | Pass |
| IPC Resistance to Solder | Pass |
| IPC Insulation Resistance | 4 × 10$^{12}$ Ohms |
| Flammability | 94-VO |

The testing parameters used to examine the properties of the photoresist are as follows:
Application to form a plating and etching photoresist The compositions were applied to 6"×6" 1 mil copper foil on epoxy/fiberglass test panels that were scrubbed with a detergent and scotchbrite and subsequently rinsed with isopropyl alcohol. The compositions were applied to yield a 1.25 mil wet film by 1) using a #17 pulldown bar or 2) Low pressure high volume paint spray or 3) Screenprinting with a 43 mesh threads per centimeter mesh screen.
Application to form a soldermask The compositions were applied to IPC-B-25 specification test boards that were scrubbed with scotchbrite/detergent and rinsed with isopropyl alcohol. The compositions were applied by 1)A #19 pulldown bar or 2) Low pressure high volume spray 3) Screenprinting with a 43 cm mesh to yield a 2.5 mil wet film.
Processing: Plating and Etching Resist After application the compositions were dried for 30 minutes at 75 degrees C. After cooling, an artwork phototool with line/space graduations from 1.5 mils to 50 mils, was placed in contact with the film surface and the fill was exposed to UV light to photopolymerize the exposed areas. After exposure, the samples were sprayed with a 1% potassium carbonate solution at 35 degrees C for 60–90 seconds to dissolve and remove the unexposed areas. The imaged photoresist was then tested in the following baths:

| | |
|---|---|
| 1. Cupric chloride etchant | 10 min. at 55° C. |
| 2. 10% Sulfuric acid microetch | 10 min. at 55° C. |
| Copper Sulfate electroplating | 5 min. Ambient |
| 3. 10% Sulfuric acid microetch. | 10 min. at 55° C. |
| Copper Sulfate electroplate | 5 min. ambient |
| Tin-Lead fluoborate electroplate | 30 min. ambient |

Following etching or plating, the residual resist was removed by spraying with a 10% sodium hydroxide solution at 50 degrees C. and 50 PSI pressure.
Processing: Soldermask After application, the composition was dried for 30 minutes at 75 degrees C. After cooling, an IPC-B-25 artwork was placed in contact with the film surface and exposed to UV light to photopolymerize the exposed areas. After exposure, the samples were sprayed with 1% potassium carbonate solution at 40 degrees C. for 60–90 seconds to dissolve and remove the unexposed areas. The sample were then post cured for 1 hour at 135 degrees C. Samples were then solder leveled for 3 seconds at 290 degrees C. The tests specified in IPC-SM-840 were then performed which the solder mask successfully passed.

Although certain presently preferred embodiments of the present invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

I claim:

1. A method of forming a photoimageable photoresist comprising the steps of:
   coating a substrate to form a film with a waterborne photoimageable composition, wherein said composition comprises by weight about 30–98% of a waterborne dispersion of an aliphatic urethane acrylate oligomer, about 1–25% photoinitiator, about 1–40% neutralizing base and an effective amount of a water soluble diacrylate monomer, wherein said aliphatic urethane acrylate oligomer and said diacrylate monomer form a latex; and
   drying said coated substrate.

2. The method of claim 1, wherein said photoimageable composition comprises an acid functionalized methacrylate oligomer neutralized with said base.

3. The method of claim 1, wherein said photoimageable composition comprises an acid functionalized methacrylate oligomer neutralized with a base wherein said aliphatic urethane acrylate oligomer, said soluble diacrylate monomer and said methacrylate oligomer form a latex.

4. The method of claim 3, wherein said photoimageable composition includes a colorant.

5. The method of claim 1, wherein said base is ammonia.

6. The method of claim 1, wherein said photoimageable composition includes a colorant.

7. The method of claim 6, wherein said composition includes an acid functionalized methacrylate oligomer neutralized with said base.

8. The method of claim 1, wherein said waterborne dispersion of an aliphatic urethane acrylate comprises at least 60 weight percent water.

9. The method of claim 1, wherein said aliphatic urethane acrylate oligomer has an acid number between about 8 and about 250.

10. The method of claim 9, wherein said acid number is at least 12.5.

11. The method of claim 1, wherein said aliphatic urethane acrylate oligomer has the following structure: $CH_2=C(R^4)-C(O)-O-A-O-C(O)-NH-R-NH-C(O)-O-R^1-O-C(O)-NH-R-NH-C(O)-O-CH_2-C(CH_3)(CO_2^{\ominus}H)-CH_2-O-C(O)-NH-R-NH-C(O)-O-R^1-O-C(O)-NH-R-NH-C(O)-NH-R^2-NH-C(O)-NH-R-NH-C-(O)-O-R^1-O-C-(O)-NH-R-NH-C(O)-O-CH_2-C(CH_3)(CO_2^{\ominus}H)-CH_2-O-C(O)-NH-R-NH-C(O)-O-R^1-O-C(O)-NH-R-NH-C(O)-O-A-O-C(O)-C(R^4)=CH_2, R^3_3NH^+$:
   wherein, $R^4$ is H or $CH_3$; A is $-CH_2-$, $-CH_2CH_2-$, $-CH_2(CH_2)_nCH_2-$, or phenyl; R is $-CH_2-$, $-CH_2CH_2-$, $-CH_2-(CH_2)_n-CH_2-$, phenyl, isophorone, tetramethyl xylene or dicyclohexyl methane; $R^1$ is $-(CH_2CH_2OCH_2CH_2)_m-$; $R^2$ is $-CH_2-(CH_2)_n-CH_2-$; $R^3$ is H, methyl, ethyl, n-propyl or n-butyl; n is 1 to 10 and m is 1 to 10.

12. The method of claim 1, wherein said photoimageable composition includes at least one anionic emulsifier.

13. The method of claim 12, wherein said anionic emulsifiers are selected from 3-hydroxy-2-hydroxymethyl-2-methyl propanoic acid, 2,6 diaminohexanoic acid, 3-N-1,2 diaminoethyl propanoic acid, 3-carboxy-phthalic anhydride, the respective sodium or potassium salts of these acids, and mixtures thereof.

14. The method of claim 1, wherein said photoimageable composition further comprises a least one acrylate copolymer.

15. The method of claim 1, wherein said photoimageable composition further comprises a styrene/maleic anhydride copolymer.

16. A method of forming a photoimageable photoresist comprising the steps:
   coating a substrate to form a film with a waterborne photoimageable composition comprising between about 30 percent and about 98 percent by weight of a waterborne dispersion of an aliphatic urethane acrylate oligomer having both anionic and non-ionic moieties, said anionic moieties comprising carboxylic acid; an effective amount of a photoinitiator which generates free radicals upon exposure to light; a neutralizing base; and an acid functionalized methacrylate oligomer neutralized with said base, said aliphatic urethane acrylate oligomer and said methacrylate oligomer form a latex; and
   allowing the coated substrate to dry.

17. The method of claim 16, wherein said composition comprises from about 1 to about 25 weight percent photoinitiator and from about 1 to about 40 weight percent neutralizing base.

18. The method of claim 17, wherein said composition includes a water soluble diacrylate monomer.

19. The method of claim 18, wherein said composition further comprises a colorant.

20. The method of claim 19, wherein said neutralizing base is ammonia.

21. The method of claim 17, wherein said neutralizing base is ammonia.

22. The method of claim 17, wherein said composition further comprises a colorant.

23. The method of claim 17, wherein the aliphatic urethane acrylate oligomer has the following structure: $CH_2=C(R^4)-C(O)-O-A-O-C(O)-NH-R-NH-C(O)-O-R^1-O-C(O)-NH-R-NH-C(O)-O-CH_2-C(CH_3)(CO_2H)-CH_2-O-C(O)-NH-R-NH-C(O)-R^1-O-C(O)-NH-R-NH-C(O)-NH-R^2-NH-C(O)-NH-R-NH-C-(O)-O-R^1-O-C-(O)-NH-R-NH-C(O)-O-CH_2-C(CH_3)(CO_2H)-CH_2-O-C(O)-NH-R-NH-C(O)-O-R^1-O-C(O)-NH-R-NH-C(O)-O-A-O-C(O)-C(R^4)=CH_2, R^3_3NH^+$:
   wherein, $R^4$ is H or $CH_3$; A is $-CH_2-$, $-CH_2CH_2-$, $-CH_2(CH_2)_nCH_2-$, or phenyl; R is $-CH_2-$, $-CH_2-CH_2-$, $-CH_2-(CH_2)_n-CH_2-$, phenyl, isophorone, tetramethyl xylene or dicyclohexyl methane; $R^1$ is $-(CH_2CH_2OCH_2CH_2)_m-$; $R^2$ is $-CH_2-(CH_2)_n-CH_2-$; R3 is H, methyl, ethyl, n-propyl or n-butyl; n is 1 to 10 and m is 1 to 10.

24. The method of claim 16, wherein said composition further comprises a colorant.

25. The method of claim 16, wherein said aliphatic urethane acrylate oligomer has an acid number between about 8 and about 250.

26. The method of claim 16, wherein said acid number is at least 12.5.

27. The method of claim 16, wherein said composition includes at least one anionic emulsifier.

28. The method of claim 27, wherein said anionic emulsifiers are selected from the group consisting of 3-hydroxy-2-hydroxymethyl-2-methyl propanoic acid, 2,6 diaminohexanoic acid, 3-N-1,2 diaminoethyl propanoic acid, 3-carboxyphthalic anhydride, the respective sodium or potassium salts of these acids and mixtures thereof.

29. The method of claim 16, wherein said composition further comprises at least one acrylate copolymer.

30. The method of claim 16, wherein said composition further comprises a styrene/maleic anhydride copolymer.

31. A method of forming a photoimageable photoresist comprising the steps:
   coating a substrate to form a film with a waterborne photoimageable composition comprising between about 30 percent and about 98 percent by weight of a waterborne dispersion of an aliphatic urethane acrylate oligomer having both anionic and non-ionic moieties, said anionic moieties comprising carboxylic acid; an effective amount of a photoinitiator which generates free radicals upon exposure to light; a neutralizing base; and an effective amount of colorant; and drying the photoimageable composition.

32. The method of claim 31, wherein said composition comprises from about 1 to about 25 weight percent photoinitiator and from about 1 to about 40 weight percent neutralizing base.

33. The method of claim 32, wherein said composition further comprises a water soluble diacrylate monomer.

34. The method of claim 31, wherein said composition includes an acid functionalized methacrylate oligomer neutralized with said base.

35. The method of claim 33, includes an acid functionalized methacrylate oligomer neutralized with said base.

* * * * *